US011292064B2

United States Patent
Fallqvist et al.

(10) Patent No.: US 11,292,064 B2
(45) Date of Patent: Apr. 5, 2022

(54) COATED CUTTING TOOL AND A METHOD FOR COATING THE CUTTING TOOL

(71) Applicant: SECO TOOLS AB, Fagersta (SE)

(72) Inventors: Mikael Fallqvist, Soderbarke (SE); Jon Andersson, Vasteras (SE)

(73) Assignee: SECO TOOLS AB, Fagersta (SE)

( * ) Notice: Subject to any disclaimer, the term of this patent is extended or adjusted under 35 U.S.C. 154(b) by 80 days.

(21) Appl. No.: 16/642,724

(22) PCT Filed: Aug. 30, 2018

(86) PCT No.: PCT/EP2018/073339
§ 371 (c)(1),
(2) Date: Feb. 27, 2020

(87) PCT Pub. No.: WO2019/043095
PCT Pub. Date: Mar. 7, 2019

(65) Prior Publication Data
US 2021/0071291 A1    Mar. 11, 2021

(30) Foreign Application Priority Data
Aug. 30, 2017 (EP) .................................. 17188637

(51) Int. Cl.
*B23B 27/14*    (2006.01)
*C23C 14/02*    (2006.01)
(Continued)

(52) U.S. Cl.
CPC .......... *B23B 27/148* (2013.01); *C23C 14/022* (2013.01); *C23C 14/0617* (2013.01); *C23C 14/0641* (2013.01); *C23C 14/081* (2013.01); *C23C 14/16* (2013.01); *C23C 14/18* (2013.01); *C23C 14/325* (2013.01); *B23B 2224/12* (2013.01); *B23B 2228/105* (2013.01)

(58) Field of Classification Search
CPC . B23B 27/14; B23B 27/148; B23B 2228/105; C23C 14/0021; C23C 14/0641; C23C 14/081; C23C 14/325
USPC ........................................ 428/697, 698, 699
See application file for complete search history.

(56) References Cited

U.S. PATENT DOCUMENTS

2007/0248424 A1   10/2007  Omori et al.
2009/0120241 A1   5/2009   Veiier
(Continued)

FOREIGN PATENT DOCUMENTS

EP    1195452 A1    4/2002
JP    2000-334607   * 12/2000
JP    2013-116509   * 1/2011

OTHER PUBLICATIONS

Gautier et al "Effectsof depositionparameters on the texture of chromium films deposited by vacuum arc evaporation" Thin Solid Films 289 p (Year: 1996).*
(Continued)

*Primary Examiner* — Archene A Turner
(74) *Attorney, Agent, or Firm* — Corinne R. Gorski

(57) ABSTRACT

A coated cutting tool includes a substrate with a coating having a total thickness of 0.25-30 μm. The coating has a first layer and a second layer, the first layer being a wear resistant PVD deposited layer having a thickness of 0.2-15 μm arranged between the substrate and the second layer, and wherein the second layer is a Cr layer.

19 Claims, 1 Drawing Sheet

(51) Int. Cl.
     *C23C 14/06*      (2006.01)
     *C23C 14/16*      (2006.01)
     *C23C 14/18*      (2006.01)
     *C23C 14/32*      (2006.01)
     *C23C 14/08*      (2006.01)

(56) References Cited

U.S. PATENT DOCUMENTS

| | | | |
|---|---|---|---|
| 2009/0169910 A1 | 7/2009 | Myrtveit | |
| 2011/0044775 A1* | 2/2011 | Johansson | C23C 14/024 |
| | | | 428/336 |
| 2011/0045245 A1* | 2/2011 | Johansson | C04B 41/009 |
| | | | 407/119 |
| 2012/0201615 A1* | 8/2012 | Ni | C23C 30/005 |
| | | | 428/698 |
| 2012/0282050 A1* | 11/2012 | Setoyama | C04B 41/90 |
| | | | 407/118 |

OTHER PUBLICATIONS

Kaito et al "The structure of thin Cr Films prepared by the vacuum evaporation method": thin Solid Films 359 p. 283-287. (Year: 2000).*

Ducros et al.: "Multilayered and nanolayered hard nitride thin films for a better yield in micro machining", May 19, 2008, URL: http://www.4m-net.org/files/papers/4M2005/02_13.PDF, Oct. 16, 2017, Sections 1, 2, 3.1.

* cited by examiner

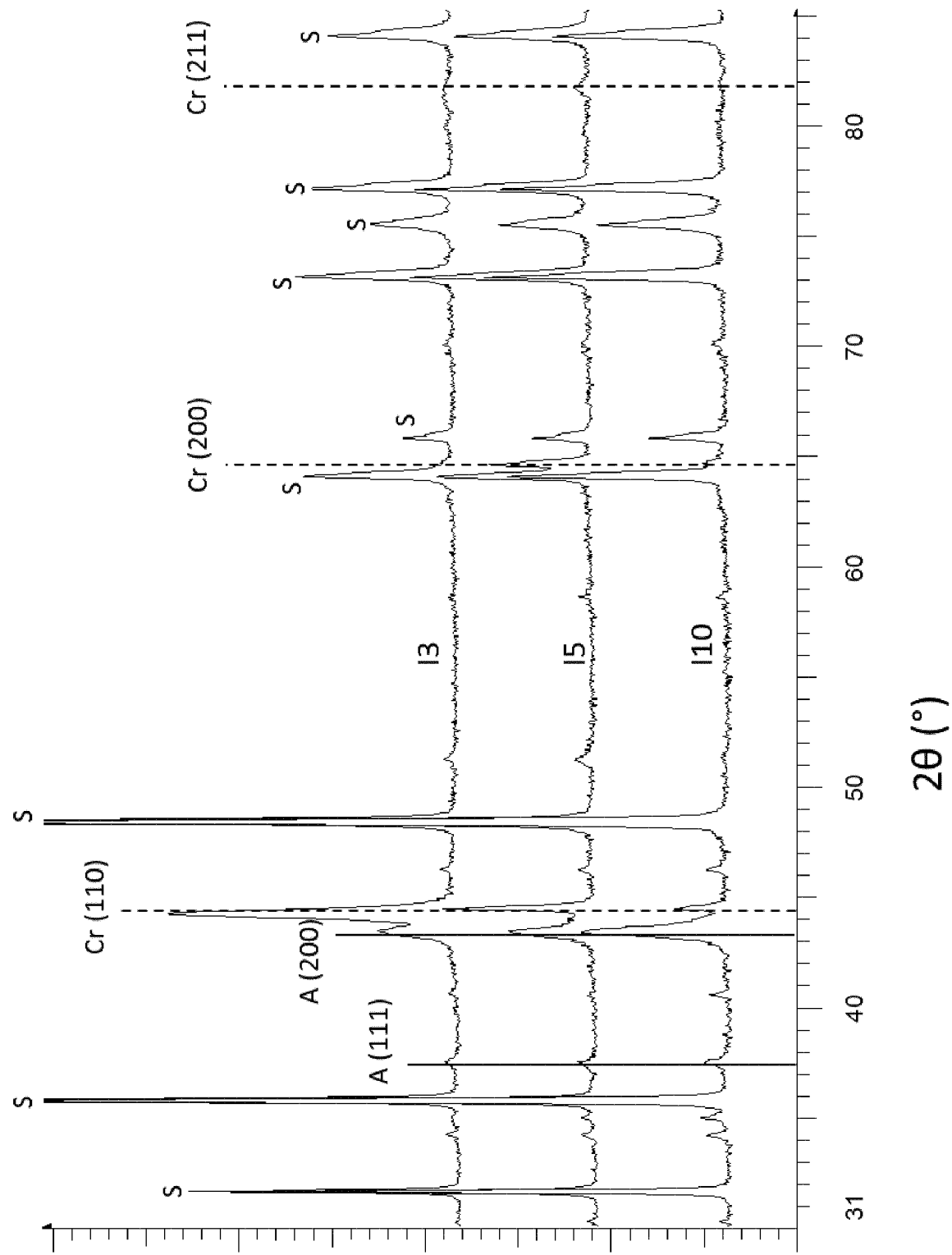

COATED CUTTING TOOL AND A METHOD FOR COATING THE CUTTING TOOL

Related Application Data

This application is a § 371 National Stage Application of PCT International Application No. PCT/EP2018/073339 filed Aug. 30, 2018 claiming priority to EP 17188637.7 filed Aug. 30, 2017.

TECHNICAL FIELD

The present invention relates to a coated cutting tool for chip forming metal machining. The invention also relates to a method for coating the cutting tool.

BACKGROUND OF THE INVENTION

Since the mid 1980's, efforts have been made to improve the properties, for example, wear resistance and hence the performance of cutting tool coatings. At that time, the common practice was to coat cutting tools with TiN. However, due to its relatively poor oxidation resistance at elevated temperatures, alloying Al in (Ti,Al)N was suggested and implemented with good results in the mid-1980's. Today (Ti,Al)N based coatings are among the most common hard and protective coating materials used in metal cutting applications. The cubic, B1, structure of (Ti,Al)N, as a monolith layer and/or part of a laminated coating structure, combine attractive mechanical properties such as high hardness and improved temperature and oxidation resistance providing good performance in metal machining applications. The technological benefits of (Ti,Al)N and its excellent physical properties, especially at elevated temperatures, is partly explained in terms of a spinodal decomposition process during which cubic (Ti,Al)N decompose isostructurally into coherent cubic c-AlN- and c-TiN-enriched domains. The combination of elastic properties and a lattice mismatch between coherent c-AlN- and c-TiN-enriched domains leads to significant age hardening during which the hardness of (Ti,Al)N thin layers have shown to increase with between 15% and 20%. At further aging, c-AlN transforms into the thermodynamically stable hexagonal, wurtzite B4 structure, h-AlN resulting in a dual phase structure comprising c-TiN and h-AlN with reduced mechanical properties.

However, in certain situations, such as machining of work materials giving rise to significant adhesive wear, the present coating solutions are in need of improvement.

OBJECT OF THE INVENTION

It is an object of the present invention to provide a coated cutting tool with a coating that improves cutting performance by optimizing the interactions between tool and work piece.

It is also an object of the present invention to provide a method for coating a cutting tool with said coating as well as the use of the cutting tool for machining of ISO M materials.

SUMMARY OF THE INVENTION

According to a first aspect of the present invention there is provided a coated cutting tool comprising a substrate with a coating having a total thickness of 0.25-30 µm, wherein the coating comprises a first layer and a second layer, and where the first layer is a wear resistant PVD deposited layer having a thickness of 0.2-15 µm, preferably 0.2-10 µm, most preferably 0.5-5 µm, the first layer is arranged between the substrate and the second layer, and wherein the second layer is a Cr (chromium) layer being an outermost layer of the coating.

According to one embodiment the Cr layer is of metallic Cr.

According to one embodiment of the invention the thickness of the Cr layer is 0.05-5 µm, preferably 0.05-3 µm.

According to one embodiment of the invention an x-ray diffraction (XRD) θ-2θ scan, collected on the coated tool using CuKα radiation, comprises body-centered cubic (bcc) structure peaks from a Cr layer.

According to one embodiment of the invention the Cr layer has a bcc structure with a crystallographic orientation relation of $0.3<R1<1$, preferably $0.4<R1<1$, where $R1=I_{(110)}/(I_{(110)}+I_{(200)}+I_{(210)})$, and where $I_{(110)}$, $I_{(200)}$, and $I_{(211)}$ are the XRD peak areas as extracted from the pseudo-Voigt peak profile fitting results of θ-2θ scans obtained with CuKα radiation for the bcc structure (110), (200), and (211) Cr layer diffraction peaks, respectively.

According to one embodiment of the invention the Cr layer has a bcc structure with a crystallographic orientation relation of $0<R2<0.6$, where $R2=I_{(200)}/(I_{(110)}+I_{(200)}+I_{(211)})$, and where $I_{(110)}$, $I_{(200)}$, and $I_{(211)}$ are the XRD peak areas as extracted from the pseudo-Voigt peak profile fitting results of θ-2θ scans obtained with CuKα radiation for the bcc structure (110), (200), and (211) Cr layer diffraction peaks, respectively.

According to one embodiment of the invention the Cr layer has a bcc structure with a crystallographic orientation relation of $0<R3<0.2$, where $R3=I_{(211)}/(I_{(110)}+I_{(200)}+I_{(211)})$, and where $I_{(110)}$, $I_{(200)}$, and $I_{(211)}$ are the XRD peak areas as extracted from the pseudo-Voigt peak profile fitting results of θ-2θ scans obtained with CuKα radiation for the bcc structure (110), (200), and (211) Cr layer diffraction peaks, respectively.

According to one embodiment of the invention the ratio between the Cr layer thickness and the total coating thickness is between 0.01 and 2, preferably between 0.01 and 1, most preferably between 0.05 and 0.5.

According to one embodiment of the present invention the first layer has a hardness $H>20$ GPa, preferably $H>24$ GPa, most preferably $40$ GPa$>H>24$ GPa, as measured by nano indentation experiments.

According to one embodiment an x-ray diffraction (XRD) θ-2θ scan, collected using CuKα radiation, comprises NaCl type structure peaks from the first layer and body-centered cubic structure peaks from a Cr layer.

According to one embodiment the ratio, R4, between the XRD peak intensity of the (110) body-centered cubic Cr peak and the XRD peak intensity of the (200) NaCl structure peak originating from the first layer is $0.05<R4<30$, where XRD peak intensity is evaluated as the peak area extracted from the pseudo-Voigt peak profile fitting results of θ-2θ scans obtained with CuKα radiation.

According to one embodiment of the present invention the first layer has NaCl type crystal structure with a crystallographic orientation relation of $0.5<RA\leq1$, where $RA=IA_{(200)}/(IA_{(200)}+IA_{(111)})$, and where $IA_{(200)}$ and $IA_{(111)}$ are the XRD peak areas as extracted from the pseudo-Voigt peak profile fitting results of θ-2θ scans obtained with CuKα radiation for the NaCl structure (200) and (111) the first layer diffraction peaks, respectively.

According to one embodiment of the invention, the peak area ratio RA is $0.6<RA\leq1$.

According to one embodiment of the invention, the peak area ratio RA is $0.5<RA<0.9$.

According to one embodiment of the invention, the peak area ratio RA is $0.6<RA<0.9$.

According to one embodiment of the invention, the peak area ratio RA is $0.5<RA<0.8$.

According to one embodiment of the invention, the coating may contain small amounts of at least one of the following: oxygen (O) and carbon (C), to a total concentration of 0 to 5 at %, preferably 0 to 2 at %, most preferably 0 to 1 at %.

According to one embodiment of the invention the first layer is a $(Ti_{1-x}Al_x)N_y$ layer with $0.1<x<0.7$ and $0.6<y<1.1$.

According to one embodiment of the invention the first layer is a NaCl structure cubic phase $c-(Ti_{1-x}Al_x)N_y$ layer, where $0.1<x<0.7$, preferably $0.4<x<0.7$, and $0.7<y<1.1$.

According to one embodiment of the invention $0.5<x<0.7$.

According to one embodiment of the invention $0.5<x<0.6$.

According to one embodiment of the invention $0.7<y<1.05$.

According to one embodiment of the present invention, the NaCl structured $c-(Ti_{1-x}Al_x)N_y$ layer optionally contains less than 5 at % each of any of the following: cubic phase c-TiN, cubic phase c-AlN and hexagonal phase h-AlN.

According to one embodiment of the present invention the first layer is a NaCl structured $(Ti_{1-v}Al_v)N_w/(Ti_{1-a}Si_a)N_b$ nanolaminate with sublayer thickness between 5 and 50 nm, where $0.1<v<0.7$, preferably $0.4<v<0.7$, $0.7<w<1.1$, $0.02<a<0.25$, preferably $0.05<a<0.15$, and $0.7<b<1.1$.

According to one embodiment of the present invention the first layer is a $(Ti_{1-m}Si_m)N_n$ layer, where $0≤m<0.25$, preferably $0≤m<0.15$, and $0.7<n<1.1$.

According to one embodiment of the present invention the first layer is a $(Cr_{1-c}Al_c)N_d$ layer, where $0.5<c<0.9$, preferably $0.5<c<0.8$, and $0.7<d<1.1$.

According to one embodiment of the present invention the first layer is a $(Cr_{1-e}Al_e)_2O_3$ layer, where $0.5<e<0.9$, preferably $0.5<e<0.8$.

According to one embodiment of the invention the substrate comprises at least one of the following: cemented carbide, cermet, ceramics, steel and cubic boron nitride.

According to one embodiment of the invention the substrate comprises cemented carbide comprising WC and 4-15 wt % Co.

According one embodiment the coating may further comprise a third layer other than the first and second layer. The third layer may be a single layer or a multilayer which may be arranged between the substrate and the first layer or between the first and second layer.

According to a second aspect of the present invention there is provided a method for producing a coated cutting tool comprising a body and a hard and wear resistant coating by applying PVD (physical vapor deposition) techniques, preferably cathodic arc deposition, the method comprising: growing a Cr layer by using pure Cr cathodes applying an evaporation current between 50 A and 200 A, a gas atmosphere containing pure Ar at a total gas pressure between 1.0 Pa and 7.0 Pa, preferably between 2.0 Pa and 5.0 Pa, and applying a deposition temperature between room temperature and 500° C. The Cr layer is arranged as an outermost layer of the coating.

According to one embodiment the above described method comprises applying a negative substrate bias between 0 V and 150 V.

According to one embodiment of the invention the method further comprises growing a first layer being a $(Ti_{1-x}Al_x)N_y$-layer, with $0.1<x<0.7$ and $0.7<y<1.1$, arranged between the body and the Cr layer, by cathodic arc evaporation with an evaporation current between 50 A and 200 A using composite and/or alloyed (Ti,Al) cathodes, and in a reactive gas atmosphere containing $N_2$ and optionally mixed with Ar, at a total gas pressure between 1.0 Pa and 7.0 Pa, preferably between 2.5 Pa and 5 Pa, with a negative substrate bias between 0 V and 300 V, preferably between 20 V and 150 V, more preferably between 30 V and 100 V at a temperature between 200° C. and 800° C., preferably between 300° C. and 600° C.

According to one embodiment of invention said first layer is a $(Ti_{1-x}Al_x)N_y$ layer, with $0.1<x<0.7$ and $0.7<y<1.1$, and is grown using composite and/or alloyed (Ti,Al) cathodes.

According to a third aspect of the present invention there is provided the use of a coated cutting tool according to any of the above described embodiments in machining of ISO M materials, such as austenitic stainless steels, at cutting speeds of 10-400 m/min, preferably 35-300 m/min, most preferably 50-200 m/min, with an average feed of 0.05-0.5 mm/rev, preferably 0.1-0.4 mm/rev, depending on cutting speed and insert geometry.

Definitions

The term "cutting tool", as used herein, is intended to denote cutting tools suitable for metal cutting by chip removal, such as turning, milling or drilling. Examples of cutting tools are indexable cutting inserts, solid drills or end mills.

The term "substrate" as denoted herein should be understood as a body onto which a coating is deposited. Common for cutting tools is that this substrate, for example, a cutting tool insert, may be a solid body or a body comprising a backing body onto which an additional material is placed, either over the cutting edge on the rake face, a so called tipped body, or such that it covers the full rake, a so called full face body. The tipped or full face solutions are frequently used in cutting technologies based on polycrystalline diamond or polycrystalline cubic boron nitride materials.

BRIEF DESCRIPTION OF THE DRAWINGS

FIG. 1 shows x-ray diffractograms for three coatings according to embodiments of the invention. Peaks marked "S" originate from the substrate, peaks marked "A" originate from a first layer, and peaks marked "Cr" originate from the Cr layer.

DETAILED DESCRIPTION OF PREFERRED EMBODIMENTS

According to the invention there is provided a coated cutting tool consisting of a substrate and a coating. The coating comprising a first layer and a second layer where the first layer is a wear resistant PVD deposited layer and the second layer is a Cr layer. The Cr layer is arranged as an outermost layer and it has surprisingly been found that the Cr layer gives improved performance in machining. The Cr layer is a PVD deposited layer and has a thickness between 0.05 μm and 3 μm.

The average composition of the layers was estimated by energy dispersive spectroscopy (EDS) analysis area using a LEO Ultra 55 scanning electron microscope (SEM) operated at 20 kV and normal incidence to the coated surface equipped with a Thermo Noran EDS. Internal standards and ZAF correction were used for the quantitative analysis. The metal composition was evaluated using a Noran System Six (NSS ver 2) software.

Coating phase detection and evaluation of preferred crystallographic orientation were performed by XRD using a Bruker AXS D8-advance x-ray diffractometer and Cu Kα radiation in Bragg-Brentano configuration. Typically, the detection limit for each phase in a polycrystalline mixed phase materials is less than 5 vol %.

FIG. 1 shows 0-2θ X-ray diffractograms collected from three coatings according to embodiments of the invention. The coating phases were indexed with respect to the JCPDS cards 01-1261 (Cr) and 38-1420 (c-TiAlN), where the latter had to be shifted to match the smaller lattice parameter of c-TiAlN compared to c-TiN. Small amounts, close to or below the detection limit of the diffraction technique, of cubic phase c-TiN, cubic phase c-AlN and hexagonal phase h-AlN phases cannot be ruled out.

The position and intensity (area) of the crystalline peaks in the XRD diffractograms are determined by fitting a pseudo-Voigt function to each crystalline peak. Additionally, the fitting function contains a linear term to account for residual scattering arising from the background. The XRD data peak fitting was conducted using the Bruker AXS Topas 2.1 software. The resulting peak areas are used to calculate the ratios R1, R2, R3, R4, and RA according to the embodiments of the invention.

Example 1

Cemented carbide (WC—Co) cutting tools with a range of compositions comprising 6 to 13 wt % Co binder balanced with tungsten carbide (WC) and other carbides of, e.g., titanium, tantalum or niobium as well as various amounts of binder alloying elements such as iron, chromium, nickel, molybdenum or alloys of these elements were used as substrate for the layer depositions by cathodic arc evaporation.

Before deposition, the cutting tools were cleaned in ultrasonic baths of an alkali solution and alcohol. The system was evacuated to a pressure of less than $2.0 \times 10^{-3}$ Pa, after which the tools were sputter cleaned with Ar ions. Then, for coatings I1-I10, a $Ti_{0.47}Al_{0.53}N$ layer was deposited at 450° C. using $Ti_{0.45}Al_{0.55}$ cathodes in a reactive $N_2$ gas atmosphere at a total gas pressure of 4.5 Pa, applying an evaporation arc current of about 150 A and a negative substrate bias of about 50 V. Subsequently, the Cr layers were deposited in separate processes without external heating using Cr cathodes in an Ar atmosphere at a total gas pressure of 4 Pa, applying an evaporation arc current of about 150 A. The substrate bias and thickness was varied for the Cr layer to produce several coatings as shown in Table 1 and for coatings I5-I10 an additional Ar etch was introduced before Cr deposition. A reference $Ti_{0.47}Al_{0.53}N$ coating, C1, without Cr layer was also produced at the same time and with same parameters as above. The first layers of coatings I11-I15 and coatings C2-C6 were also deposited by cathodic arc evaporation using similar process parameters, except coatings I15 and C6 in which the chromium aluminium oxide layer was deposited in a pure $O_2$ atmosphere at a pressure of about 1 Pa.

The XRD peak intensity ratios as defined in the embodiments of the invention are shown in table 1.

TABLE 1

Specifications and properties of the coatings.

| Coating Inventive | Layer A Composition | Thickness | RA | Cr layer Thickness | Bias | R1 | R2 | R3 | R4 |
|---|---|---|---|---|---|---|---|---|---|
| I1 | $Ti_{0.47}Al_{0.53}N$ | 2 μm | 0.87 | 0.1 μm | 0 | 0.85 | 0.01 | 0.14 | 0.11 |
| I2 | $Ti_{0.47}Al_{0.53}N$ | 2 μm | 0.87 | 0.3 μm | 0 | 0.87 | 0.01 | 0.12 | 0.68 |
| I3 | $Ti_{0.47}Al_{0.53}N$ | 2 μm | 0.83 | 0.8 μm | 0 | 0.93 | 0.02 | 0.05 | 4.11 |
| I4 | $Ti_{0.47}Al_{0.53}N$ | 2 μm | 0.94 | 2.4 μm | 0 | 0.91 | 0.04 | 0.05 | 19.91 |
| I5 | $Ti_{0.47}Al_{0.53}N$ | 2 μm | 0.88 | 0.8 μm | 0 | 0.53 | 0.39 | 0.08 | 0.71 |
| I6 | $Ti_{0.47}Al_{0.53}N$ | 2 μm | 0.87 | 0.8 μm | 10 | 0.44 | 0.46 | 0.10 | 0.51 |
| I7 | $Ti_{0.47}Al_{0.53}N$ | 2 μm | 0.87 | 0.8 μm | 25 | 0.44 | 0.50 | 0.06 | 0.46 |
| I8 | $Ti_{0.47}Al_{0.53}N$ | 2 μm | 0.86 | 0.8 μm | 50 | 0.46 | 0.49 | 0.05 | 0.43 |
| I9 | $Ti_{0.47}Al_{0.53}N$ | 2 μm | 0.88 | 0.8 μm | 100 | 0.56 | 0.37 | 0.07 | 0.28 |
| I10 | $Ti_{0.47}Al_{0.53}N$ | 2 μm | 0.88 | 0.8 μm | 150 | 0.63 | 0.30 | 0.07 | 0.13 |
| I11 | $Ti_{0.38}Al_{0.62}N/Ti_{0.93}Si_{0.07}N$* | 2.5 μm | 0.86 | 0.3 μm | 0 | 0.90 | 0.01 | 0.09 | 0.54 |
| I12 | $Ti_{0.93}Si_{0.07}N$ | 2.5 μm | 0.97 | 0.3 μm | 0 | 0.92 | 0.02 | 0.06 | 0.12 |
| I13 | TiN | 2.5 μm | 0.30 | 0.3 μm | 0 | 0.90 | 0.01 | 0.09 | 1.36 |
| I14 | $Cr_{0.31}Al_{0.69}N$ | 2.5 μm | —** | 0.3 μm | 0 | —** | —** | —** | —** |
| I15 | $(Cr_{0.30}Al_{0.70})_2O_3$ | 2.5 μm | —*** | 0.3 μm | 0 | 0.94 | 0.02 | 0.04 | —*** |

| Comparative | Composition | Thickness | RA | Hardness |
|---|---|---|---|---|
| C1 | $Ti_{0.47}Al_{0.53}N$ | 2 μm | 0.87 | 31 GPa |
| C2 | $Ti_{0.38}Al_{0.62}N/Ti_{0.93}Si_{0.07}N$* | 2.5 μm | 0.86 | 29 GPa |
| C3 | $Ti_{0.93}Si_{0.07}N$ | 2.5 μm | 0.97 | 30 GPa |
| C4 | TiN | 2.5 μm | 0.30 | 28 GPa |
| C5 | $Cr_{0.31}Al_{0.69}N$ | 2.5 μm | —** | 30 GPa |
| C6 | $(Cr_{0.30}Al_{0.70})_2O_3$ | 2.5 μm | —*** | 25 GPa |

*Nanolaminate with sublayer thickness about 10 nm.
**Could not be evaluated due to peak overlaps
***Not evaluated since coating is not in NaCl structure The hardness of coating C1, corresponding to the first layer of coatings I1-I10, was evaluated from nanoindentation experiments, after mechanical polishing of the surface, using a UMIS 2000 nanoindentation system with a Berkovich diamond tip and a maximum tip load of 25 mN. The hardness was evaluated from the load-displacement curves using the method of Oliver and Pharr [W. C. Oliver and G. M. Pharr, J. Mater. Res. 7, 1564 (1992)]. An average of about 30 indents was made and a fused silica reference sample was used to check calibration. The hardness of coatings C2-C6, corresponding to the first layers of coatings I11-I15, was also evaluated from nanoindentation experiments, after mechanical polishing of the surface, using a Berkovich diamond tip and a maximum tip load of 4 mN. The hardness was evaluated from the load-displacement curves using the method of Oliver and Pharr [W. C. Oliver and G. M. Pharr, J. Mater. Res. 7, 1564 (1992)]. An average of about 20 indents was made and a fused silica reference sample was used to check calibration. The thus evaluated hardnesses of coatings C1-C6 are shown in Table 1. The standard error was estimated to ±2 GPa.

Example 2

WC—Co inserts (ISO geometry TPUN160308) with about 6 wt % Co and coated with inventive coatings I2-I4 and comparative coating C1 from Example 1 were tested in turning of 316L. The test was made with repeated 5 mm cutting lengths, using the following data:
Cutting speed: 80 m/min
Feed: 0.2 mm/rev
Depth of cut: 2 mm
Performance criterion: Flank wear Table 2 shows a lower flank wear for the inventive coatings relative to the reference comparative coating.

TABLE 2

| Relative flank wear. | |
| --- | --- |
| Coating | Flank wear |
| I2 | 73 |
| I3 | 77 |
| I4 | 71 |
| C1 | 100 |

Example 3

WC—Co inserts (ISO geometry TPUN160308) with about 13 wt % Co and coated with coatings I1 and C1 from Example 1 were tested in turning of 316L with the following data:
Cutting speed: 150 m/min
Feed: 0.2 mm/rev
Depth of cut: 3 mm
Performance criterion: Flank wear The resulting flank wear of the inventive coating I1 was about 80% of the flank wear of the reference comparative coating.

Example 4

WC—Co inserts (ISO geometry XOMX120408TR-ME08) with about 13 wt % Co and coated with coatings I1 and C1 from Example 1 were tested in milling of 316L with the following data:
Milling cutter: R417.69-2525.3-12-3A
Cutting speed: 120 m/min
Feed: 0.19 mm/tooth
Depth of cut: 5 mm
$a_e$: 3 mm (12%)
Performance criterion: Flank wear The resulting flank wear of the inventive coating I1 was about 65% of the flank wear of the reference comparative coating.

Example 5

WC—Co inserts (ISO geometry TPUN160308) with about 6 wt % Co and coated with inventive coatings I2-I10 and comparative coating C1 from Example 1 were tested in turning of 316L. The test was made with repeated 20 mm cutting lengths using the following data:
Cutting speed: 80 m/min
Depth of cut: 2 mm
Performance criterion: Flank wear Table 3 shows a lower flank wear for the inventive coatings relative to the reference comparative coating.

TABLE 3

| Relative flank wear. | |
| --- | --- |
| Coating | Flank wear |
| I2 | 91 |
| I3 | 71 |
| I4 | 82 |
| I5 | 89 |
| I6 | 86 |
| I7 | 69 |
| I8 | 78 |
| I9 | 85 |
| I10 | 70 |
| C1 | 100 |

Example 6

WC—Co inserts (ISO geometry SNUN120308) with about 6 wt % Co and coated with inventive coatings I1 and I11-I15 and comparative coatings C1-C6 from Example 1 were tested in sliding tests which were performed using a commercially available scratch tester (CSM Instruments Revetest®). In the test, a stainless steel (AISI 316L) pin with a diameter of 10 mm and a polished ($R_a$=25 nm) hemispherical shaped end surface (radius 5 mm) was loaded against the PVD coated cemented carbide inserts. Sliding tests were performed under dry conditions in ambient air (21-22° C., 25-26% RH) using a normal load of 20 N and a relative sliding speed of 10 mm/min. The sliding distance was 10 mm and each test was repeated three times. During testing friction coefficient and acoustic emission were continuously recorded.

The reduction in measured friction coefficient for each inventive coating compared to the corresponding comparative coating is shown in Table 4. It is clear that the inventive coatings show a significant decrease in friction coefficient compared to their corresponding comparative coating.

| Inventive coating | Comparative coating | Friction reduction |
| --- | --- | --- |
| I1 | C1 | 40% |
| I11 | C2 | 18% |

-continued

| Inventive coating | Comparative coating | Friction reduction |
|---|---|---|
| I12 | C3 | 16% |
| I13 | C4 | 19% |
| I14 | C5 | 22% |
| I15 | C6 | 17% |

The invention claimed is:

1. A coated cutting tool comprising a substrate with a coating having a total thickness of 0.25-30 µm, wherein the coating includes a first layer and a second layer, and wherein the first layer is a wear resistant PVD deposited layer having a thickness of 0.2-15 µm, the first layer being arranged between the substrate and the second layer, the first layer being
a $(Ti_{1-x}Al_x)N_y$ layer with $0.1<x<0.7$ and $0.6<y<1.1$, or
a NaCl structured $(Ti_{1-v}Al_v)N_w/(Ti_{1-a}Si_a)N_b$ nanolaminate with sublayer thickness between 5 and 50 nm, where $0.1<v<0.7$, $0.7<w<1.1$, $0.02<a<0.25$, and $0.7<b<1.1$, or
a $(Ti_{1-m}Si_m)N_n$ layer, where $0≤m<0.25$, and $0.7<n<1.1$, or
a $(Cr_{1-c}Al_c)N_d$ layer, where $0.5<c<0.9$, and $0.7<d<1.1$, or
a $(Cr_{1-e}Al_e)_2O_3$ layer, where $0.5<e<0.9$, and wherein the second layer is a Cr layer, the Cr layer being an outermost layer of the coating.

2. The coated cutting tool according to claim 1, wherein a thickness of the Cr layer is 0.05-5 µm.

3. The coated cutting tool according to claim 1, wherein the Cr layer is a PVD deposited layer.

4. The coated cutting tool according to claim 1, wherein the Cr layer has a body-centered cubic structure with a crystallographic orientation relation of $0.3<R1<1$, where $R1=I_{(110)}/(I_{(110)}+I_{(200)}+I_{(211)})$, and where $1_{(110)}$, $1_{(200)}$, and $1_{(211)}$ are the XRD peak areas as extracted from the pseudo-Voigt peak profile fitting results of θ-2θ scans obtained with CuKα radiation for the bcc structure Cr layer diffraction peaks.

5. The coated cutting tool according to claim 1, wherein the first layer is a $(Ti_{1-x}Al_x)N_y$ layer with $0.1<x<0.7$ and $0.7<y<1.1$.

6. The coated cutting tool according to claim 1, wherein the first layer is a NaCl structure c-$(Ti_{1-x}Al_x)N_y$ layer, where $0.1<x<0.7$, and $0.7<y<1.1$.

7. The coated cutting tool according to claim 5, wherein $0.5<x<0.6$.

8. The coated cutting tool according to claim 1, wherein the first layer is a NaCl structured $(Ti_{1-v}Al_v)N_w/(Ti_{1-a}Si_a)N_b$ nanolaminate with a sublayer thickness between 5 and 50 nm, and wherein $0.4<v<0.7$, , $0.7<w<1.1$, $0.02<a<0.25$, and $0.7<b<1.1$.

9. The coated cutting tool according to claim 1, wherein the first layer is a $(Ti_{1-m}Si_m)N_n$ layer, where $0<m<0.15$, and $0.7<n<1.1$.

10. The coated cutting tool according to claim 1, wherein the first layer is a $(Cr_{1-c}Al_c)N_d$ layer, where $0.5<c<0.8$, and $0.7<d<1.1$.

11. The coated cutting tool according to claim 1, wherein the first layer is a $(Cr_{1-e}Al_e)_2O_3$ layer, where $0.5<e<0.8$.

12. The coated cutting tool according to claim 1, wherein a ratio between the Cr layer thickness and the total coating thickness is between 0.01 and 2.

13. The coated cutting tool according to claim 1, wherein the first layer has a hardness H>20 GPa.

14. The coated cutting tool according to claim 1, wherein the first layer has a NaCl type structure and the Cr layer has a body-centered cubic structure, the ratio, R4, between the XRD peak intensity of the body-centered cubic Cr peak and the XRD peak intensity of the NaCl structure peak originating from the first layer is $0.05<R4<30$, where XRD peak intensity is evaluated as the peak area extracted from the pseudo-Voigt peak profile fitting results of θ-2θ scans obtained with CuKα radiation.

15. The coated cutting tool according to claim 1, wherein the substrate comprises at least one of the following: cemented carbide, cermet, ceramics, steel and cubic boron nitride.

16. The coated cutting tool according to claim 15, wherein the cemented carbide includes WC and 4-15 wt % Co.

17. A method for producing of a coated cutting tool comprising the steps of:
applying a substrate of cemented carbide, cermet, ceramic, steel or cubic boron nitride with a hard and wear resistant coating having a thickness of 0.25-30 µm by means of PVD (physical vapor deposition) techniques, such as cathodic arc deposition, wherein the coating includes a first layer, the first layer being
a $(Ti_{1-x}Al_x)N_y$ layer with $0.1<x<0.7$ and $0.6<y<1.1$, or
a NaCl structured $(Ti_{1-v}Al_v)N_w/(Ti_{1-a}Si_a)N_b$ nanolaminate with sublayer thickness between 5 and 50 nm, where $0.1<v<0.7$, $0.7<w<1.1$, $0.02<a<0.25$, and $0.7<b<1.1$, or
a $(Ti_{1-m}Si_m)N_n$ layer, where $0≤m<0.25$, and $0.7<n<1.1$, or
a $(Cr_{1-c}Al_c)N_d$ layer, where $0.5<c<0.9$, and $0.7<d<1.1$, or
a $(Cr_{1-e}Al_e)_2O_3$ layer, where $0.5<e<0.9$
and a second layer, the second layer being a Cr layer arranged as an outermost layer of the coating; and
growing the Cr layer by using pure Cr cathodes applying an evaporation current between 50 A and 200 A, a gas atmosphere containing pure Ar at a total gas pressure between 1.0 Pa and 7.0 Pa, and applying a deposition temperature between room temperature and 500° C.

18. The method according to claim 17, further comprising growing a first layer being a $(Ti_{1-x}Al_x)N_y$-layer, with $0.1<x<0.7$ and $0.7<y<1.1$, between the substrate and the Cr layer, by cathodic arc evaporation with an evaporation current between 50 A and 200 A using composite and/or alloyed (Ti,Al) cathodes, and in a reactive gas atmosphere containing $N_2$ and optionally mixed with Ar, at a total gas pressure between 1.0 Pa and 7.0 Pa, with a negative substrate bias between 0 V and 300 V, at a temperature between 200° C. and 800° C.

19. A coated cutting tool comprising a substrate with a coating having a total thickness of 0.25-30 µm, wherein the coating includes a first layer and a second layer, and wherein the first layer is a wear resistant PVD deposited layer having a thickness of 0.2-15 µm, the first layer being arranged between the substrate and the second layer, and wherein the second layer is a Cr layer, the Cr layer being an outermost layer of the coating, wherein the Cr layer has a body-centered cubic structure with a crystallographic orientation relation of $0.3<R1<1$, where $R1=I_{(110)}/(I_{(110)}+I_{(200)}+I_{(211)})$, and where $I_{(110)}$, $1_{(200)}$, and $1_{(211)}$ are the XRD peak areas as extracted from the pseudo-Voigt peak profile fitting results of θ-2θ scans obtained with CuKα radiation for the bcc structure Cr layer diffraction peaks.

* * * * *